United States Patent
Bae et al.

(10) Patent No.: US 8,044,757 B2
(45) Date of Patent: Oct. 25, 2011

(54) ELECTRONIC DEVICE INCLUDING LTCC INDUCTOR

(75) Inventors: Hyun-Cheol Bae, Daejeon (KR);
Kwang-Seong Choi, Daejeon (KR);
Yong Sung Eom, Daejeon (KR); Jong Tae Moon, Chungcheongnam-do (KR);
Moo Jung Chu, Daejeon (KR);
Jong-Hyun Lee, Gyeonggi-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/648,117

(22) Filed: Dec. 28, 2009

(65) Prior Publication Data

US 2011/0018670 A1    Jan. 27, 2011

(30) Foreign Application Priority Data

Jul. 21, 2009   (KR) .................. 10-2009-0066230

(51) Int. Cl.
*H01F 5/00*    (2006.01)
*H01F 27/29*   (2006.01)
*H01F 27/28*   (2006.01)
*H01L 23/34*   (2006.01)
*H01L 23/48*   (2006.01)

(52) U.S. Cl. ........ 336/200; 336/192; 336/222; 336/223; 336/232; 257/724; 257/737; 257/738

(58) Field of Classification Search .................. None
See application file for complete search history.

(56) References Cited

U.S. PATENT DOCUMENTS

| | | | |
|---|---|---|---|
| 5,532,667 A | 7/1996 | Haertling et al. | |
| 6,052,287 A * | 4/2000 | Palmer et al. | 361/767 |
| 6,054,914 A * | 4/2000 | Abel et al. | 336/200 |
| 6,362,525 B1 * | 3/2002 | Rahim | 257/738 |
| 6,407,929 B1 * | 6/2002 | Hale et al. | 361/763 |
| 7,795,728 B2 * | 9/2010 | Przadka | 257/724 |
| 7,847,669 B2 * | 12/2010 | Ayazi et al. | 336/200 |
| 2003/0151485 A1 * | 8/2003 | Lewis | 336/200 |
| 2006/0176135 A1 * | 8/2006 | Winter et al. | 336/200 |
| 2006/0180897 A1 * | 8/2006 | Park et al. | 257/619 |
| 2007/0045773 A1 * | 3/2007 | Mi et al. | 257/531 |
| 2007/0090912 A1 * | 4/2007 | Lee | 336/200 |

(Continued)

FOREIGN PATENT DOCUMENTS

KR    2007-0094576 A    9/2007

(Continued)

OTHER PUBLICATIONS

Ki Chan Eun et al. "Air Cavity Incorporation to LTCC Spiral Inductor for High Q-factor and SRF" International Journal Electronics and Communications (AEU) 58 (2004) pp. 434-436.

(Continued)

*Primary Examiner* — Anh Mai
*Assistant Examiner* — Mangtin Lian
(74) *Attorney, Agent, or Firm* — Rabin & Berdo, P.C.

(57) ABSTRACT

Provided is an electronic device that includes an LTCC inductor including a first sheet disposed on a substrate and including a first conductive pattern, a second sheet disposed on the first sheet and including a second conductive pattern, and a via electrically connecting the first conductive pattern to the second conductive pattern, and a spacer disposed on a lower surface of the first sheet to provide an air gap between the substrate and the first sheet, wherein the first conductive pattern is exposed out of the lower surface of the first sheet.

10 Claims, 11 Drawing Sheets

U.S. PATENT DOCUMENTS

2007/0247268 A1    10/2007    Oya et al.
2008/0303120 A1    12/2008    Lee et al.

FOREIGN PATENT DOCUMENTS

KR      10-0835061 B1    5/2008

OTHER PUBLICATIONS

Yeun-Ho Joung et al. "Chip-to-Board Micromachining for Interconnect Layer Passive Components" IEEE Transactions on Components and Packaging Technologies, vol. 30, No. 1, Mar. 2007 pp. 15-23.

* cited by examiner

ELECTRONIC DEVICE INCLUDING LTCC INDUCTOR

CROSS-REFERENCE TO RELATED APPLICATIONS

This U.S. non-provisional patent application claims priority under 35 U.S.C. §119 of Korean Patent Application No. 10-2009-0066230, filed on Jul. 21, 2009, the entire contents of which are hereby incorporated by reference.

BACKGROUND

The present invention disclosed herein relates to a low temperature cofired ceramic (LTCC) inductor, and more particularly, to an electronic device including an LTCC inductor.

Recently, electronic devices are required to be miniaturized and have high performance. To this end, a three dimensional stacking technology for manufacturing various integrated circuits and passive devices in a single module through a system-in-package process has been widely used.

According to a low temperature cofired ceramic (LTCC) technology, inner electrodes and passive devices are printed on a plurality of green sheets formed of glass-ceramic based material, so as to form a desired circuit, and then, the green sheets are stacked and cofired to manufacture a multi-chip module.

Through the LTCC technology, a circuit substrate and a combination module having high performance and high reliability can be fabricated. At first, the LTCC technology was expected to be used in various fields, but the LTCC technology was limited only to fields requiring special reliability, such as super computer fields or aerospace fields. Thus, the market of the LTCC technology was not expanded because of typical resin multi layered substrates. However, as the mobile communication market has rapidly grown in recent years, the LTCC technology is being widely used to achieve the miniaturization, low cost and high performance of a high frequency analog circuit.

Typical ceramic multi-layered substrates, formed of alumina-based material, require a high temperature firing process. However, according to the LTCC technology, glass-based material is added to perform a low temperature firing process. As such, a firing temperature is decreased to use a high electrical conductive metal, having low cost and low melting temperature, as the material of an interconnection of an inner layer. In addition, the LTCC technology prevents the shrinkage of a green sheet in an x-axis direction and a y-axis direction, so as to fabricate a circuit without modifying an initial design.

The LTCC technology is used for power amplifier modules, engine control units (ECUs) for automobiles, band pass filters, micro antennas, and wireless interfaces of mobile phones, so as to achieve high frequency, high reliability, low cost, miniaturization and low power consumption of a product.

SUMMARY

The present invention provides an LTCC inductor having a high quality factor and a high self resonant frequency characteristic.

Embodiments of the present invention provide electronic devices including: a low temperature cofired ceramic (LTCC) inductor including: a first sheet disposed on a substrate and including a first conductive pattern; a second sheet disposed on the first sheet and including a second conductive pattern; and a via electrically connecting the first conductive pattern to the second conductive pattern; and a spacer disposed on a lower surface of the first sheet to provide an air gap between the substrate and the first sheet, wherein the first conductive pattern is exposed out of the lower surface of the first sheet.

In some embodiments, the LTCC inductor may further include a plurality of sheets including a conductive pattern.

In other embodiments, an upper surface of the substrate may be recessed to form an air cavity that provides an additional air gap between the LTCC inductor and the substrate.

In still other embodiments, the first conductive pattern may include a first conductive line and first and second connections respectively disposed at both ends of the first conductive line, and the second conductive pattern may include a second conductive line and third and fourth connections respectively disposed at both ends of the second conductive line.

In even other embodiments, the first conductive line may cross the second conductive line, the first connection may be electrically connected to the fourth connection through the via, and the second connection may be electrically connected to the third connection through the via.

In yet other embodiments, the electronic devices may further include an input/output terminal electrically connected to one of the first and second conductive lines, wherein the input/output terminal is electrically connected to the substrate.

In further embodiments, the LTCC inductor may be electrically connected to the substrate through the spacer.

In still further embodiments, the second conductive pattern may include the input/output terminal that is electrically connected to the spacer through the via disposed in the first sheet.

In even still further embodiments, the first conductive pattern may include the input/output terminal that is electrically connected to the spacer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
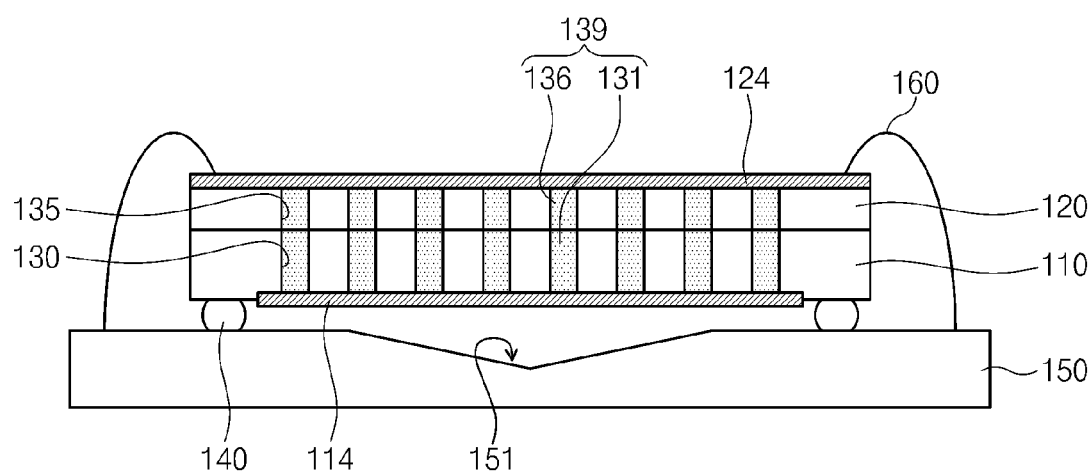
FIG. 1 is a cross-sectional view illustrating an electronic device including an LTCC inductor and a method of mounting the LTCC inductor, according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

In the specification, it will be understood that when a layer such as a conductive layer, a semiconductor layer or a dielectric is referred to as being 'on' another layer or substrate, it can be directly on the other layer or substrate, or intervening layers may also be present. Also, though terms like a first, a second, and a third are used to describe a specific grade, grades are not limited to these terms. These terms are used only to discriminate one grade from another grade.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views and/or plan views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, although an etch region is illustrated as a right-angled region, the etch region may be actually round or have a predetermined curvature. Areas exemplified in the drawings have general properties, and are used to illustrate a specific shape of a device region. Thus, this should not be construed as limited to the scope of the present invention.

Figure 2:
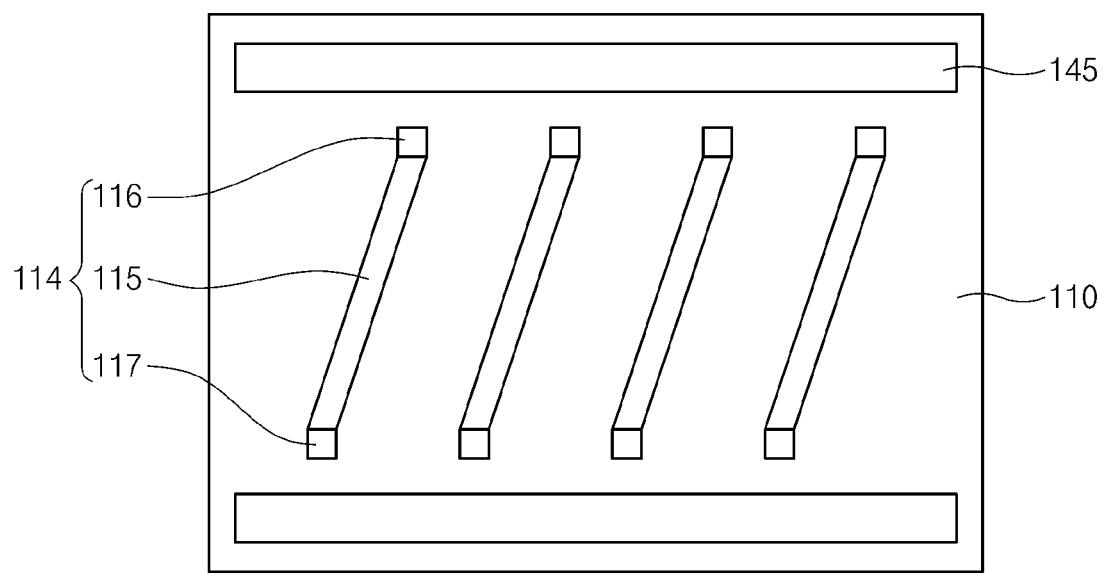
FIGS. 2 and 3 are plan views illustrating a first sheet and a second sheet according to the embodiment of FIG. 1.
Figure 3:
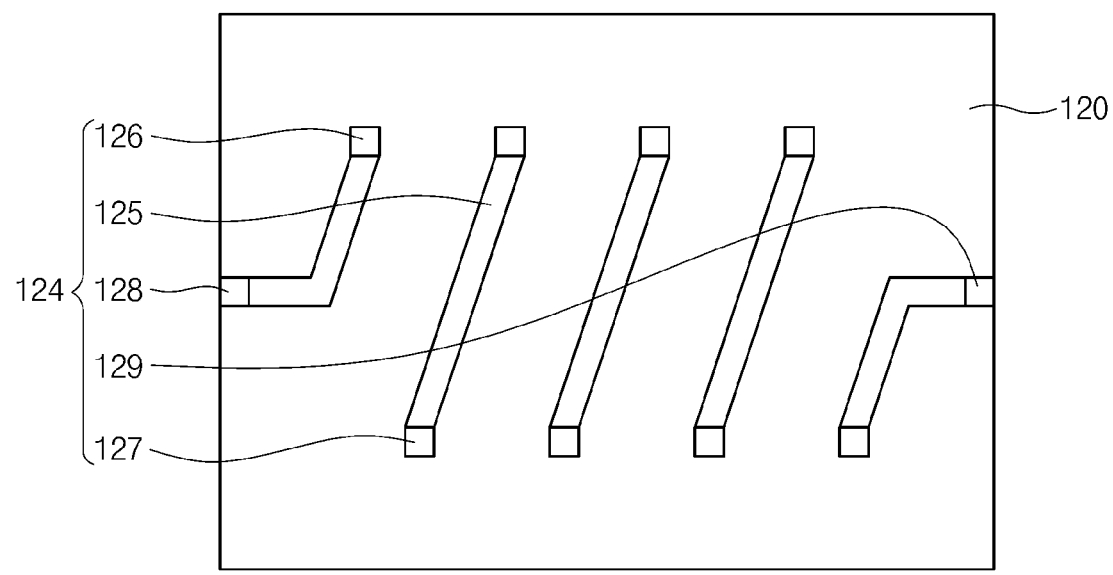

FIGS. 1 through 3 are schematic views illustrating an electronic device including a low temperature cofired ceramic (LTCC) inductor according to an embodiment of the present invention.

Referring to FIGS. 1 through 3, the LTCC inductor is mounted on a substrate 150. The LTCC inductor may include first and second sheets 110 and 120 that may be green sheets. The green sheet may be formed by mixing ceramic powder, a dispersant, solvent, a polymer binder, a plasticizer, and, if necessary, an additive in a predetermined ratio.

FIG. 2 is a plan view illustrating the lower surface of the first sheet 110. The lower surface of the first sheet 110 may be provided with first conductive patterns 114 that may be formed of at least one selected from the group consisting of Au, Ag, and Cu. The first conductive patterns 114 may be formed through a typical LTCC process such as a screen printing process and an ink jet printing process. The first conductive pattern 114 may include a first conductive lines 115 and first and second connections 116 and 117 that are connected to both ends of the first conductive lines 115. The first conductive lines 115 may be oblique and parallel to each other.

The lower surface of the first sheet 110 may be provided with mounting portions 145 that may be spaced apart from the first conductive patterns 114 and that may be formed together with the first conductive patterns 114 through the same process as that of the first conductive patterns 114. The shape of the mounting portions 145 is not limited to the shape of FIG. 2, provided that a shape is adapted for mounting. That is, the shape of the mounting portions 145 may be varied according to a connection method to a substrate.

FIG. 3 is a plan view illustrating the upper surface of the second sheet 120. Second conductive patterns 124 may be disposed on the upper surface of the second sheet 120, and formed through the same process as that of the first conductive patterns 114. The second conductive pattern 124 may include a second conductive lines 125 and third and forth connections 126 and 127 connected to both ends of the second conductive lines 125. The second conductive lines 125 may be oblique and parallel to each other. The second conductive lines 125 may cross the first conductive lines 115. The second conductive patterns 124 may further include input/output terminals 128 and 129 that may be connected to the second conductive lines 125. The input/output terminals 128 and 129 may be used as members that are electrically connected to the substrate 150 that will be described later.

Referring to FIGS. 1 through 3, the first sheet 110 may be provided with first via holes 130 that may be disposed on the first and second connections 116 and 117. The first via holes 130 may be formed by punching portions of the first sheet 110. First preliminary vias 131 may be formed by filling the first via holes 130 with conductive paste.

The second sheet 120 may be provided with second via holes 135 that may be disposed under the third and fourth connections 126 and 127. The second via holes 135 may be formed through the same process as that of the first via holes 130. Second preliminary vias 136 may be formed by filling the second via holes 135 with conductive paste. The second preliminary vias 136 and the first preliminary vias 131 constitute vias 139 through which the first conductive patterns 114 may be electrically connected to the second conductive patterns 124.

According to the current embodiment, the first conductive patterns 114, the second conductive patterns 124, and the vias 139 may be electrically connected to each other to constitute a solenoid type inductor. That is, the third connections 126 are electrically connected to the second connections 117 through the vias 139, and the fourth connections 127 are electrically connected to the first connections 116 through the vias 139. Thus, an electrical signal input through the input terminal 128 repeatedly passes through the first conductive patterns 114, the vias 139, and the second conductive patterns 124, and then, arrives at the output terminal 129. Thus, according to the current embodiment, the first conductive patterns 114, the vias 139, and the second conductive patterns 124 may constitute a solenoid type LTCC inductor. The first conductive patterns 114 and the second conductive patterns 124 are modified to adjust the number of turns or the thickness of the LTCC inductor and vary inductance. The thickness of a dielectric between the first conductive patterns 114 and the second conductive patterns 124 may be adjusted, or an additional dielectric sheet may be provided to vary inductance. Thus, an inductor having large inductance, which is difficult to fabricate on an integrated circuit, is easily fabricated using an external inductor.

Since the first conductive patterns 114 disposed on the lower surface of the first sheet 110 are exposed to air, the LTCC inductor according to the current embodiment has less parasitic capacitance than that of an embedded LTCC inductor mounted in a substrate. A quality factor (hereinafter, referred to as a Q value) of an inductor is the ratio of inductive reactance to the resistance of the inductor at a given frequency. The Q value of an inductor denotes the efficiency of the inductor. Typically, as a frequency is increased in a GHz level band, the Q value is increased and then decreased after reaching the maximum value, so as to form a parabola. At this point, a region where the Q value is increased or decreased according to frequency variation depends on a resistance component and a parasitic capacitance component of an inductor. That is, when parasitic capacitance is decreased, a Q value is improved. According to the current embodiment, since the first conductive patterns 114 are exposed to air that has low permittivity, the LTCC inductor according to the current embodiment has less parasitic capacitance than that of an embedded LTCC inductor, so as to obtain a high Q value.

Furthermore, the LTCC inductor according to the current embodiment has a high self resonant frequency characteristic. A self resonant frequency is a frequency in which the function of an inductor is lost due to increase in parasitic components. That is, since the LTCC inductor according to the current embodiment reduces parasitic capacitance, a self resonant frequency is increased.

A firing process is performed in the state where the second sheet 120 is disposed on the first sheet 110. The firing process may be performed at a low temperature of about 1000° C. or less, like a typical LTCC process. The LTCC inductor is completed through the firing process.

The LTCC inductor is disposed on the substrate 150 that includes a silicon substrate, a PCB substrate, or an IC chip. The upper surface of the substrate 150 may be recessed to form an air cavity 151 that provides an additional space between the substrate 150 and the LTCC inductor. The air cavity 151 is not limited to the shape illustrated in FIG. 1, and thus, may be any structure providing an additional space. According to the current embodiment, the air cavity 151 may have one of a V-shaped vertical cross section, a U-shaped vertical cross section, and a tetragonal vertical cross section. The air cavity 151 may be formed through a wet etch process, a dry etch process, or a photo process. According to the current embodiment, a wet etch process using an etch solution including potassium hydroxide (KOH), tetramethyl ammonium hydroxide (TMAH), and ethylene diamine pyrocatechol (EDP) is performed to form the air cavity 151.

Spacers 140 may be disposed between the LTCC inductor and the substrate 150. The spacers 140 provide an air gap between the substrate 150 and the LTCC inductor. Accordingly, an air layer is maintained under the exposed first conductive patterns 114. Thus, a high Q value and a high self resonant frequency can be obtained as described above. The spacers 140 are not limited to the shapes illustrated in FIG. 1, provided that the substrate 150 is spaced apart from the LTCC inductor. For example, the spacers 140 may be solder balls, Cu pillars, stud bumps, or polymer balls. According to the current embodiment, the spacers 140 may be disposed on the mounting portions 145. That is, solder paste is applied on the mounting portions 145 and the substrate 150, and solder balls are disposed therebetween, so as to provide an air gap between the LTCC inductor and the substrate 150.

According to the current embodiment, the substrate 150 is electrically connected to the input terminal 128 and the output terminal 129 through wires 160.

Figure 4:
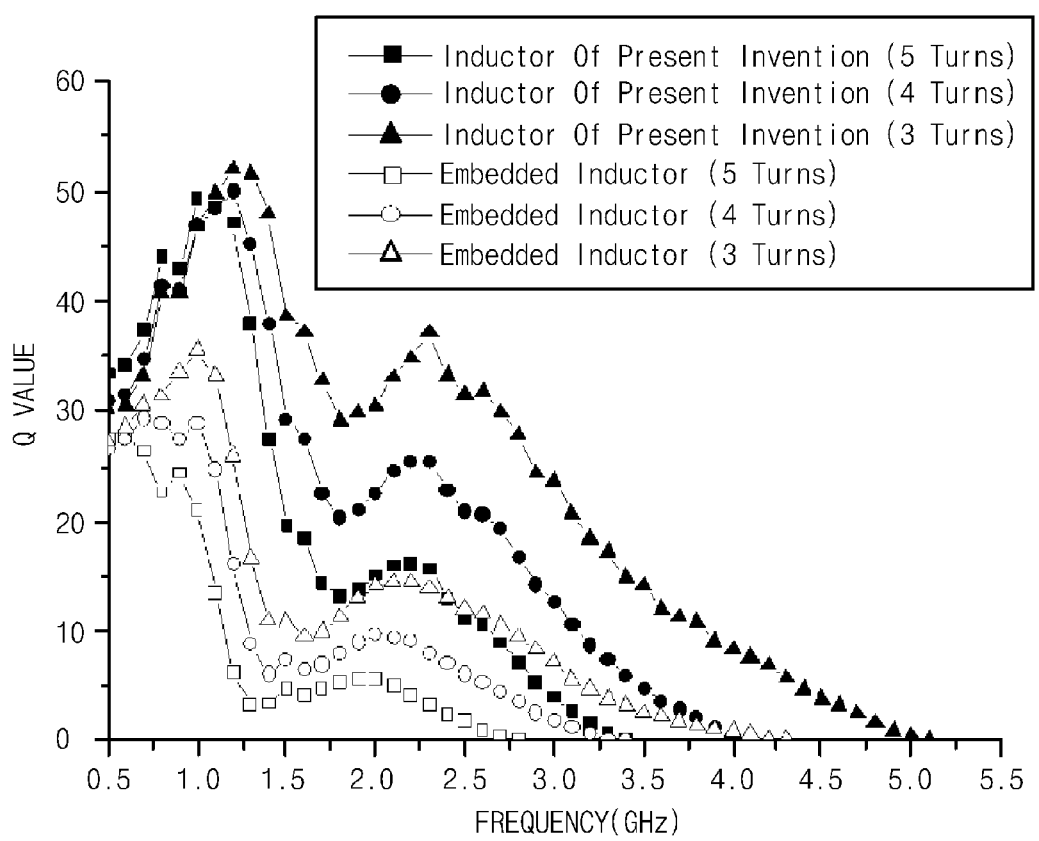
FIG. 4 is a graph illustrating a Q value of an LTCC inductor according to embodiments of the present invention.

FIG. 4 is a graph illustrating a Q value of the LTCC inductor according to the current embodiment. Referring to FIG. 4, while a typical embedded solenoid inductor has the maximum Q value of about 35, the LTCC inductor having a spacer and an air cavity has the maximum Q value of about 52, and thus, the Q value is increased by about 40%. Further, as the number of turns is increased, a Q value of the typical embedded solenoid inductor is quickly decreased, but the LTCC inductor still has a high Q value. In addition, the LTCC inductor according to the current embodiment has a high self resonant frequency. In FIG. 4, a self resonant frequency is a frequency where a Q value is zero.

Figure 5:
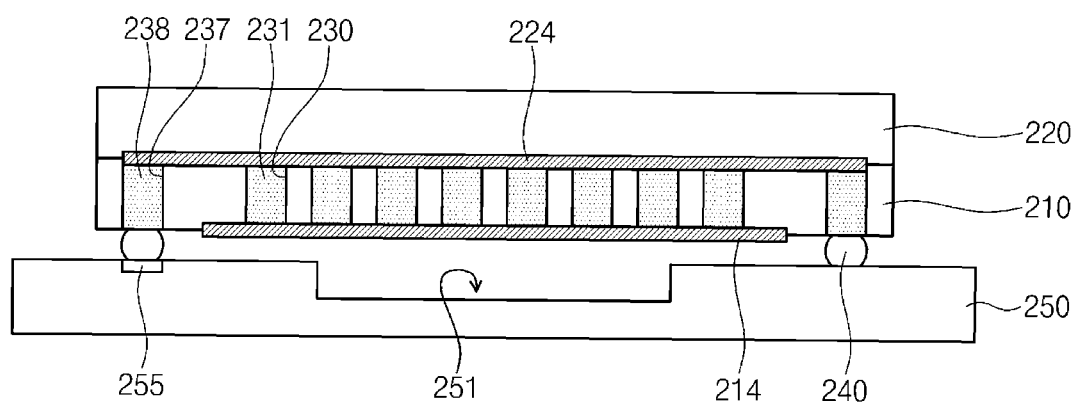
FIG. 5 is a cross-sectional view illustrating an electronic device including an LTCC inductor and a method of mounting the LTCC inductor, according to another embodiment of the present invention.
Figure 6:
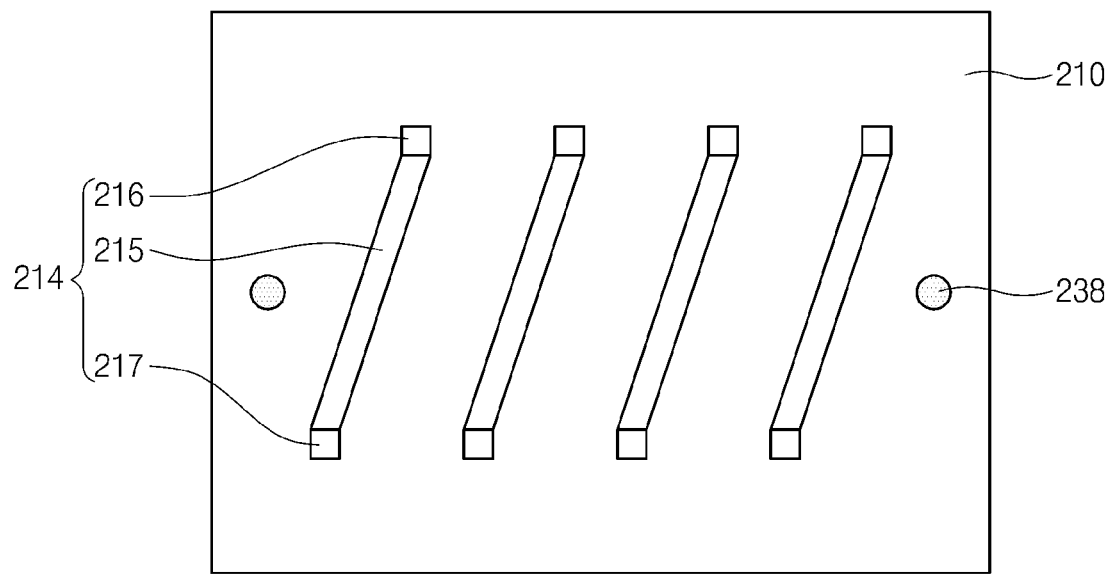
FIGS. 6 and 7 are plan views illustrating a first sheet and a second sheet according to the embodiment of FIG. 5.
Figure 7:
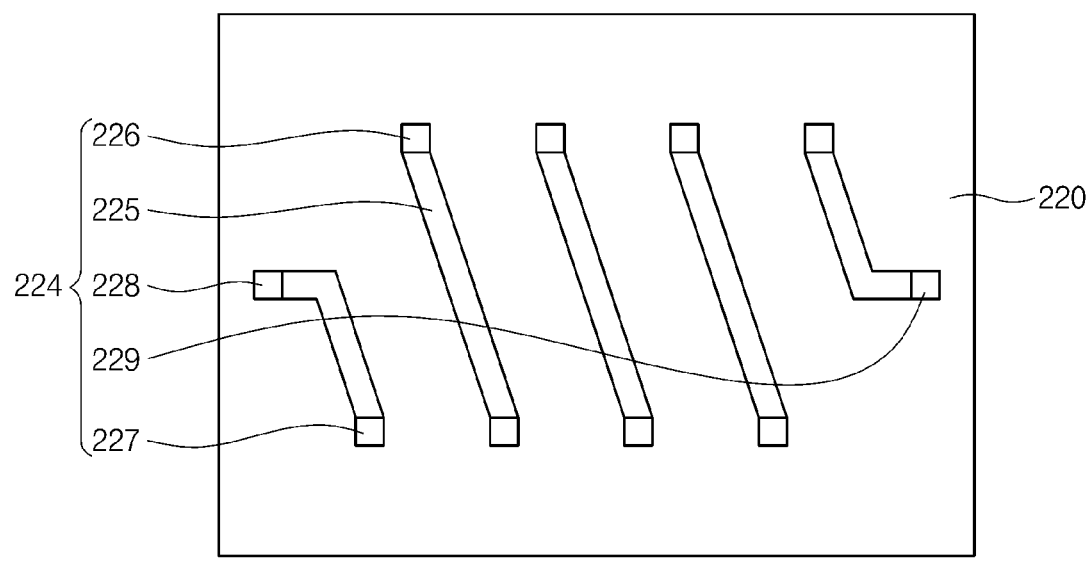

FIGS. 5 through 7 are a cross-sectional view and plan views illustrating an electronic device including an LTCC inductor according to an embodiment. Since the current embodiment is similar to the previous one except for electrical connection structure of the LTCC inductor, and the configuration of spacers 240, a description of the same part as that of the previous embodiment will be omitted.

Referring to FIGS. 5 through 7, the LTCC inductor is mounted on a substrate 250. The LTCC inductor may include first and second sheets 210 and 220 that may be green sheets. The green sheet may be formed by mixing ceramic powder, a dispersant, solvent, a polymer binder, a plasticizer, and, if necessary, an additive in a predetermined ratio.

FIG. 6 is a plan view illustrating the lower surface of the first sheet 210. The lower surface of the first sheet 210 may be provided with first conductive patterns 214 that may be formed of at least one selected from the group consisting of Au, Ag, and Cu. The first conductive patterns 214 may be formed through a typical LTCC process such as a screen printing process and an ink jet printing process. The first conductive pattern 214 may include a first conductive lines 215 and first and second connections 216 and 217 that are connected to both ends of the first conductive lines 215. The first conductive lines 215 may be oblique and parallel to each other.

FIG. 7 is a plan view illustrating the lower surface of the second sheet 220. Second conductive patterns 224 may be disposed on the lower surface of the second sheet 220, and formed through the same process as that of the first conductive patterns 214. The second conductive pattern 224 may include a second conductive lines 225 and third and forth connections 226 and 227 connected to both ends of the second conductive lines 225. The second conductive lines 225 may be oblique and parallel to each other. The second conductive lines 225 may cross the first conductive lines 215. The second conductive patterns 224 may further include an input terminal 228 and an output terminal 229 that may be connected to the second conductive lines 225. The input terminal 228 and the output terminal 229 may be used as members that are electrically connected to the substrate 250 that will be described later.

Referring to FIGS. 5 through 7, the first sheet 210 may be provided with first via holes 230 that may be disposed on the first and second connections 216 and 217. The first via holes 230 may be formed by punching portions of the first sheet 210. First vias 231 may be formed by filling the first via holes 230 with conductive paste. The first conductive patterns 214 may be electrically connected to the second conductive patterns 224 through the first vias 231.

The first sheet 210 may be provided with second via holes 237 that may be disposed under the input terminal 228 and the output terminal 229. The second via holes 237 may be formed through the same process as that of the first via holes 230. Second vias 238 may be formed by filling the second via holes 237 with conductive paste.

According to the current embodiment, the first conductive patterns 214, the second conductive patterns 224, and the first vias 231 may be electrically connected to each other to constitute a solenoid type inductor. That is, the third connections 226 are electrically connected to the first connections 216 through the first vias 231, and the fourth connections 227 are electrically connected to the second connections 217 through the vias 231. Thus, an electrical signal input through the input terminal 228 repeatedly passes through the first conductive patterns 214, the first vias 231, and the second conductive patterns 224, and then, arrives at the output terminal 229. Thus, according to the current embodiment, the first conductive patterns 214, the first vias 231, and the second conductive patterns 224 may constitute a solenoid type LTCC inductor. The first conductive patterns 214 and the second conductive patterns 224 are modified to adjust the number of turns or the thickness of the LTCC inductor and vary inductance. The thickness of a dielectric between the first conductive patterns 214 and the second conductive patterns 224 may be adjusted, or an additional dielectric sheet may be provided to vary inductance. Thus, an inductor having large inductance, which is difficult to fabricate on an integrated circuit, is easily fabricated using an external inductor.

Since the first conductive patterns 214 disposed on the lower surface of the first sheet 210 are exposed to air, the LTCC inductor according to the current embodiment has less parasitic capacitance than that of an embedded LTCC inductor mounted in a substrate. A quality factor (hereinafter, referred to as a Q value) of an inductor is the ratio of inductive reactance to the resistance of the inductor at a given frequency. The Q value of an inductor denotes the efficiency of the inductor. Typically, as a frequency is increased in a GHz level band, the Q value is increased and then decreased after reaching the maximum value, so as to form a parabola. At this point, a region where the Q value is increased or decreased according to frequency variation depends on a resistance component and a parasitic capacitance component of an inductor. That is, when parasitic capacitance is decreased, a Q value is improved. According to the current embodiment, since the first conductive patterns 214 are exposed to air that has low permittivity, the LTCC inductor according to the current embodiment has less parasitic capacitance than that of an embedded LTCC inductor, so as to obtain a high Q value.

Furthermore, the LTCC inductor according to the current embodiment has a high self resonant frequency characteristic. A self resonant frequency is a frequency in which the function of an inductor is lost due to increase in parasitic components. That is, since the LTCC inductor according to the current embodiment reduces parasitic capacitance, a self resonant frequency is increased.

A firing process is performed in the state where the second sheet 220 is disposed on the first sheet 210. The firing process may be performed at a low temperature of about 1000° C. or less, like a typical LTCC process. The LTCC inductor is completed through the firing process.

The LTCC inductor is disposed on the substrate 250 that includes a silicon substrate, a PCB substrate, or an IC chip. The upper surface of the substrate 250 may be recessed to form an air cavity 251 that provides an additional space between the substrate 250 and the LTCC inductor. The air cavity 251 is not limited to the shape illustrated in FIG. 5, and thus, may be any structure providing an additional space. According to the current embodiment, the air cavity 251 may have one of a V-shaped vertical cross section, a U-shaped vertical cross section, and a tetragonal vertical cross section. The air cavity 251 may be formed through a wet etch process, a dry etch process, or a photo process.

The spacers 240 may be disposed between the LTCC inductor and the substrate 250. The spacers 240 provide an air gap between the substrate 250 and the LTCC inductor. Accordingly, an air layer is maintained under the exposed first conductive patterns 214. Thus, a high Q value and a high self resonant frequency can be obtained as described above. The spacers 240 are not limited to the shapes illustrated in FIG. 5, provided that the substrate 250 is spaced apart from the LTCC inductor.

According to the current embodiment, the spacers 240 may be formed of conductive materials such as solder balls to electrically connect the LTCC inductor to the substrate 250. That is, unlike the previous embodiment, the spacers 240 provide an air gap between the LTCC inductor and the substrate 250, and simultaneously, electrically connect the LTCC inductor to the substrate 250. The spacers 240 are electrically connected to the second vias 238 that are electrically connected to the input terminal 228 and the output terminal 229. To this end, a pad 255 may be disposed on the substrate 250. Thus, the LTCC inductor is electrically connected to the substrate 250.

Figure 8:
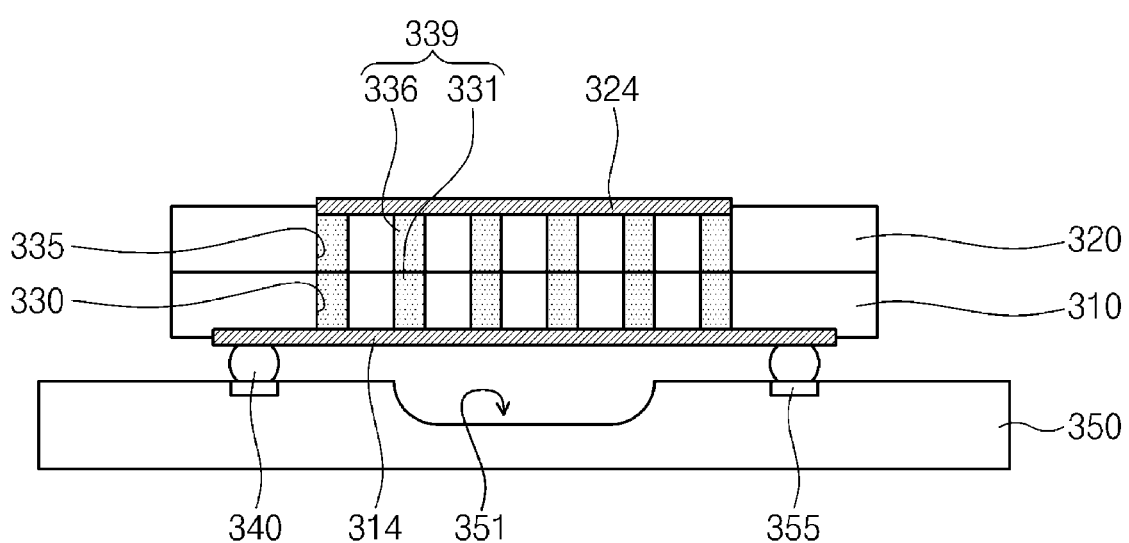
FIG. 8 is a cross-sectional view illustrating an electronic device including an LTCC inductor and a method of mounting the LTCC inductor, according to another embodiment of the present invention.
Figure 9:
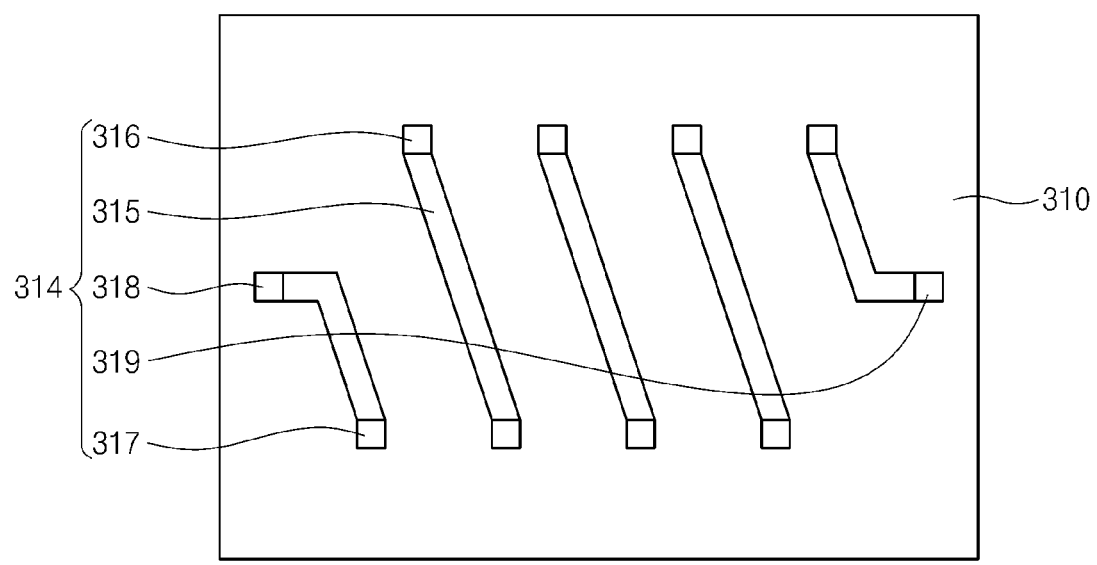
FIGS. 9 and 10 are plan views illustrating a first sheet and a second sheet according to the embodiment of FIG. 8.
Figure 10:
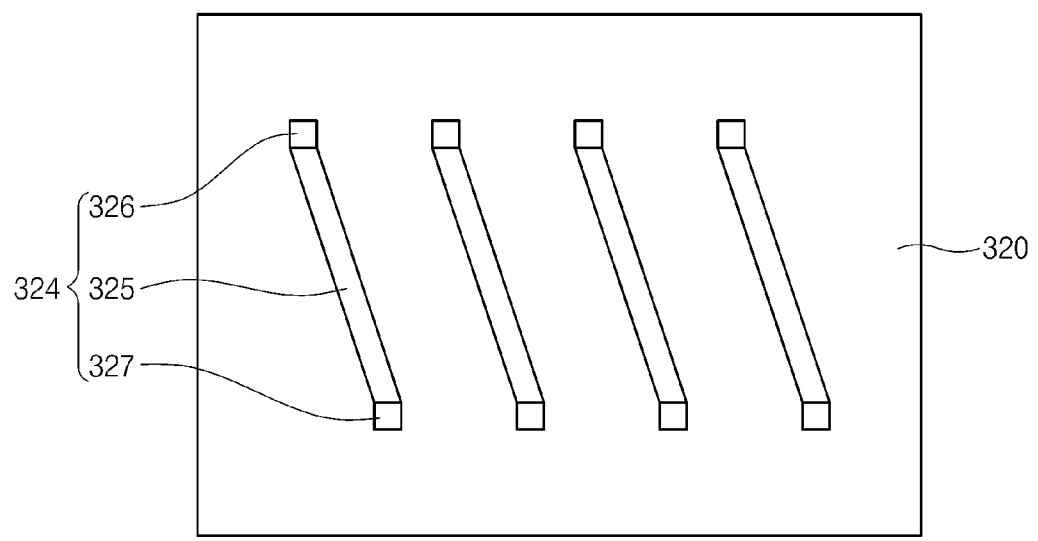

FIGS. 8 through 10 are a cross-sectional view and plan views illustrating an electronic device including an LTCC inductor according to an embodiment. Since the current embodiment is similar to the embodiment of the FIG. 1 except for electrical connection structure of the LTCC inductor, and the configuration of spacers 340, a description of the same part as that of the embodiment of the FIG. 1 will be omitted.

Referring to FIGS. 8 through 10, the LTCC inductor is mounted on a substrate 350. The LTCC inductor may include first and second sheets 310 and 320 that may be green sheets. The green sheet may be formed by mixing ceramic powder, a dispersant, solvent, a polymer binder, a plasticizer, and, if necessary, an additive in a predetermined ratio.

FIG. 9 is a plan view illustrating the lower surface of the first sheet 310. The lower surface of the first sheet 310 may be provided with first conductive patterns 314 that may be formed of at least one selected from the group consisting of Au, Ag, and Cu. The first conductive patterns 314 may be formed through a typical LTCC process such as a screen printing process and an ink jet printing process. The first conductive pattern 314 may include a first conductive line 315 and first and second connections 316 and 317 that are connected to both ends of the first conductive line 315. The first conductive lines 315 may be oblique and parallel to each other. The first conductive patterns 314 may further include input/output terminals 318 and 319. The input/output terminals 318 and 319 may be connected to the first conductive lines 315. The input/output terminals 318 and 319 may be used as members that are electrically connected to the substrate 350 that will be described later.

FIG. 10 is a plan view illustrating the upper surface of the second sheet 320. Second conductive patterns 324 may be disposed on the upper surface of the second sheet 320, and formed through the same process as that of the first conductive patterns 314. The second conductive pattern 324 may include a second conductive line 325 and third and forth connections 326 and 327 connected to both ends of the second conductive line 325. The second conductive lines 325 may be oblique and parallel to each other. The second conductive line 325 may cross the first conductive line 315.

Referring to FIGS. 8 through 10, the first sheet 310 may be provided with first via holes 330 that may be disposed on the first and second connections 316 and 317. The first via holes 330 may be formed by punching portions of the first sheet 310. First preliminary vias 331 may be formed by filling the first via holes 330 with conductive paste.

The second sheet 320 may be provided with second via holes 335 that may be disposed under the third and forth connections 326 and 327. The second via holes 335 may be formed through the same process as that of the first via holes 330. Second preliminary vias 336 may be formed by filling the second via holes 335 with conductive paste. The second preliminary vias 336 and the first preliminary vias 331 constitute vias 339 through which the first conductive patterns 314 may be electrically connected to the second conductive patterns 324.

Figure 11:
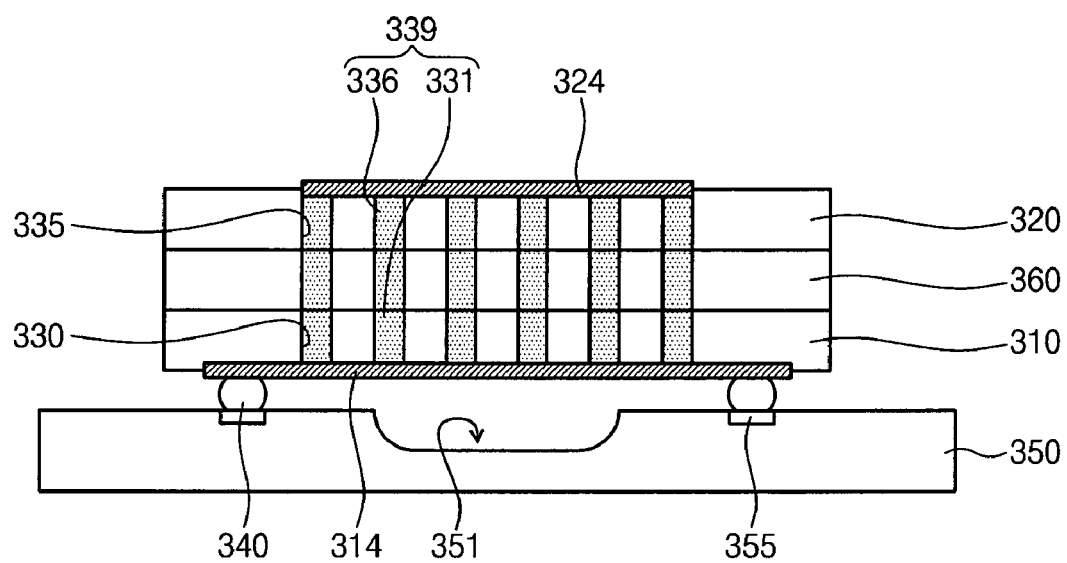
FIG. 11 is a cross-sectional view illustrating an electronic device including an LTCC inductor that is similar to one shown in FIG. 8 but includes a dielectric sheet between the first and second sheets.

According to the current embodiment, the first conductive patterns 314, the second conductive patterns 324, and the vias 339 may be electrically connected to each other to constitute a solenoid type inductor. That is, the third connections 326 are electrically connected to the second connections 317 through the vias 339, and the fourth connections 327 are electrically connected to the first connections 316 through the vias 339. Thus, an electrical signal input through the input terminal 318 repeatedly passes through the first conductive patterns 314, the vias 339, and the second conductive patterns 324, and then, arrives at the output terminal 319. Thus, according to the current embodiment, the first conductive patterns 314, the vias 339, and the second conductive patterns 324 may constitute a solenoid type LTCC inductor. The first conductive patterns 314 and the second conductive patterns 324 are modified to adjust the number of turns or the thickness of the LTCC inductor and vary inductance. The thickness of a dielectric between the first conductive patterns 314 and the second conductive patterns 324 may be adjusted, or an additional dielectric sheet may be provided to vary inductance. For example, as shown in FIG. 11, an additional dielectric sheet 360 may be formed between the first sheet 310 and the second sheet 320. Thus, an inductor having large inductance, which is difficult to fabricate on an integrated circuit, is easily fabricated using an external inductor.

Since the first conductive patterns 314 disposed on the lower surface of the first sheet 310 are exposed to air, the LTCC inductor according to the current embodiment has less parasitic capacitance than that of an embedded LTCC inductor mounted in a substrate. A quality factor (hereinafter, referred to as a Q value) of an inductor is the ratio of inductive reactance to the resistance of the inductor at a given frequency. The Q value of an inductor denotes the efficiency of the inductor. Typically, as a frequency is increased in a GHz level band, the Q value is increased and then decreased after reaching the maximum value, so as to form a parabola. At this point, a region where the Q value is increased or decreased according to frequency variation depends on a resistance component and a parasitic capacitance component of an inductor. That is, when parasitic capacitance is decreased, a Q value is improved. According to the current embodiment, since the first conductive patterns 314 are exposed to air that has low permittivity, the LTCC inductor according to the current embodiment has less parasitic capacitance than that of an embedded LTCC inductor, so as to obtain a high Q value.

Furthermore, the LTCC inductor according to the current embodiment has a high self resonant frequency characteristic. A self resonant frequency is a frequency in which the function of an inductor is lost due to increase in parasitic components. That is, since the LTCC inductor according to the current embodiment reduces parasitic capacitance, a self resonant frequency is increased.

A firing process is performed in the state where the second sheet 320 is disposed on the first sheet 310. The firing process may be performed at a low temperature of about 1000° C. or less, like a typical LTCC process. The LTCC inductor is completed through the firing process.

The LTCC inductor is disposed on the substrate 350 that includes a silicon substrate, a PCB substrate, or an IC chip. The upper surface of the substrate 350 may be recessed to form an air cavity 351 that provides an additional space between the substrate 350 and the LTCC inductor. The air cavity 351 is not limited to the shape illustrated in FIG. 8, and thus, may be any structure providing an additional space. According to the current embodiment, the air cavity 351 may have one of a V-shaped vertical cross section, a U-shaped vertical cross section, and a tetragonal vertical cross section. The air cavity 351 may be formed through a wet etch process, a dry etch process, or a photo process.

The spacers 340 may be disposed between the LTCC inductor and the substrate 350. The spacers 340 provide an air gap between the substrate 350 and the LTCC inductor. Accordingly, an air layer is maintained under the exposed first conductive patterns 314. Thus, a high Q value and a high self resonant frequency can be obtained as described above. The spacers 340 are not limited to the shapes illustrated in FIG. 8, provided that the substrate 350 is spaced apart from the LTCC inductor.

According to the current embodiment, the spacers 340 may be formed of conductive materials such as solder balls to electrically connect the LTCC inductor to the substrate 350. That is, unlike the embodiment of FIG. 1, the spacers 340 provide an air gap between the LTCC inductor and the substrate 350, and simultaneously, electrically connect the LTCC inductor to the substrate 350. The spacers 340 are electrically connected to the input/output terminals 318 and 319. To this end, pads 355 may be disposed on the substrate 350. Thus, the LTCC inductor is electrically connected to the substrate 350.

According to the embodiments of the present invention, the conductive patterns of the lower sheet of the LTCC inductor are exposed to air, and the spacers or the air cavity are disposed between the LTCC inductor and the substrate, thus obtaining a high quality factor and a high self resonant frequency characteristic.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising:
a low temperature cofired ceramic (LTCC) inductor including: a first sheet disposed on a substrate and including a first conductive pattern; a second sheet disposed on the first sheet and including a second conductive pattern; and a via electrically connecting the first conductive pattern to the second conductive pattern; and
a spacer disposed on a lower surface of the first sheet to provide an air gap between the substrate and the first sheet,
wherein the first conductive pattern is exposed out of the lower surface of the first sheet,
wherein the first conductive pattern comprises an input conductive line, a first conductive line, and an output conductive line, an input terminal electrically connected to the input conductive line, and an output terminal electrically connected to the output conductive line,
wherein the spacer includes an input spacer and an output spacer, the input terminal is electrically connected to the substrate through the input spacer that comes in physical and electrical contact with the input terminal, and the output terminal is electrically connected to the substrate through the output spacer that comes in physical and electrical contact with the output terminal, wherein the first conductive line is spaced apart from a top surface of the substrate, without being in physical contact with the spacer; and wherein an upper surface of the substrate is recessed to form an air cavity.

2. The electronic device of claim 1, wherein the air cavity has one of a V-shaped vertical cross section, a U-shaped vertical cross section, and a tetragonal vertical cross section.

3. The electronic device of claim 1, wherein the spacer comprises one of a solder ball, a stud bump, and a copper filler, so as to provide the air gap between the first conductive pattern and the substrate.

4. The electronic device of claim 1, wherein the LTCC inductor is one of a solenoid type inductor, a spiral inductor, a helical inductor, and a symmetrical inductor.

5. The electronic device of claim 1, further comprising a dielectric sheet between the first and second sheets.

6. The electronic device of claim 1, wherein the second conductive pattern is disposed on an upper surface of the second sheet.

7. The electronic device of claim 1, wherein the first conductive pattern comprises first and second connections respectively disposed at both ends of the first conductive line, and the second conductive pattern comprises a second conductive line and third and fourth connections respectively disposed at both ends of the second conductive line.

8. The electronic device of claim 7, wherein the first conductive line crosses the second conductive line, the first connection is electrically connected to the fourth connection through the via, and the second connection is electrically connected to the third connection through the via.

9. The electronic device of claim 1, wherein the input conductive line, the first conductive line and the output conductive line are electrically connected in series.

10. The electronic device of claim 6, wherein the first conductive pattern is disposed on the lower surface of the first sheet, and the first sheet is attached to the second sheet such that no conductive pattern is embedded between the upper surface of the second sheet and the lower surface of the first sheet.

* * * * *